(12) United States Patent
Chen

(10) Patent No.: US 11,864,652 B1
(45) Date of Patent: Jan. 9, 2024

(54) GEOMETRIC REINFORCING STRUCTURE FOR SLIDE RAIL

(71) Applicant: MARTAS PRECISION SLIDE CO., LTD., New Taipei (TW)

(72) Inventor: Wan-Lai Chen, New Taipei (TW)

(73) Assignee: MARTAS PRECISION SLIDE CO., LTD., New Taipei (TW)

( * ) Notice: Subject to any disclaimer, the term of this patent is extended or adjusted under 35 U.S.C. 154(b) by 0 days.

(21) Appl. No.: 17/853,884

(22) Filed: Jun. 29, 2022

(51) Int. Cl.
*A47B 88/483* (2017.01)
*H05K 7/14* (2006.01)

(52) U.S. Cl.
CPC ......... *A47B 88/483* (2017.01); *H05K 7/1489* (2013.01); *A47B 2210/0002* (2013.01)

(58) Field of Classification Search
CPC .......... A47B 88/483; A47B 2210/0002; H05K 7/1489
See application file for complete search history.

(56) References Cited

U.S. PATENT DOCUMENTS

| | | | | |
|---|---|---|---|---|
| 5,076,712 A * | 12/1991 | Salice | .................. | A47B 88/487 384/19 |
| 8,843,052 B2 * | 9/2014 | Yokoyama | ............. | B65H 1/266 271/145 |
| 9,854,690 B1 * | 12/2017 | Frye | ...................... | H05K 7/1489 |
| 10,743,661 B1 * | 8/2020 | Wu | ........................ | A47B 96/06 |
| 11,419,229 B1 * | 8/2022 | An | ....................... | H05K 7/1489 |
| 2016/0262538 A1 * | 9/2016 | Chen | ..................... | A47B 96/025 |
| 2016/0296017 A1 * | 10/2016 | Chen | ..................... | H05K 7/183 |
| 2017/0007020 A1 * | 1/2017 | McElveen | ............ | A47B 88/483 |
| 2017/0340111 A1 * | 11/2017 | Chen | ....................... | F16C 29/04 |
| 2017/0363144 A1 * | 12/2017 | Chen | ..................... | A47B 88/43 |
| 2018/0070723 A1 * | 3/2018 | Chen | ..................... | A47B 88/49 |
| 2018/0177071 A1 * | 6/2018 | Liu | ...................... | H05K 7/1489 |
| 2018/0324971 A1 * | 11/2018 | Grady | ................... | H05K 7/1489 |
| 2020/0187378 A1 * | 6/2020 | Shen | ..................... | A47B 96/021 |
| 2021/0410316 A1 * | 12/2021 | Linares Rivas | ......... | G06F 1/185 |
| 2022/0304183 A1 * | 9/2022 | Yao | ....................... | H02B 1/052 |

(Continued)

FOREIGN PATENT DOCUMENTS

| | | | | |
|---|---|---|---|---|
| AT | 523828 B1 | * | 12/2021 | |
| CA | 2255324 C | * | 6/2006 | ............. B66C 23/70 |
| TW | I448262 | | 8/2014 | |

(Continued)

*Primary Examiner* — Hanh V Tran
(74) *Attorney, Agent, or Firm* — Fei-Hung Yang

(57) ABSTRACT

Disclosed is a geometric reinforcing structure for a slide rail. The slide rail includes an inner rail, a middle rail, an outer rail and slip elements. The slip elements are movably installed between the inner and middle rails and between the middle and outer rails respectively, such that the inner and middle rails can be sequentially pulled out and extended relative to the outer rail. Except the remaining part that overlaps the inner and outer rails, the middle rail is formed with geometric reinforcing blocks by stamping, and the reinforcing blocks are equidistantly arranged along the extension direction of the middle rail, and all or part of the reinforcing blocks are rotated with an angle, or the reinforcing blocks have a configuration means with a slope and form an interference portion between two adjacent reinforcing blocks to greatly improve the load strength of pulling out in an application.

12 Claims, 7 Drawing Sheets

(56) References Cited

U.S. PATENT DOCUMENTS

2023/0157449 A1* 5/2023 Isele ................. E05D 5/0276
                                                       312/294

FOREIGN PATENT DOCUMENTS

| TW | I578886 | 4/2017 | | |
|---|---|---|---|---|
| TW | 1610639 | 1/2018 | | |
| WO | WO-2011147991 A1 * | 12/2011 | ............. | B60N 2/062 |

* cited by examiner

GEOMETRIC REINFORCING STRUCTURE FOR SLIDE RAIL

BACKGROUND

Technical Field

The present disclosure relates to the field of a slide rail structure, and more particularly relates to a geometric reinforcing structure for a slide rail in which a plurality of geometric shaped reinforcing blocks is spaced apart from each other on a middle rail, and an interference portion is formed between any two adjacent reinforcing blocks to achieve the effect of increasing the strength of pulling out a load without increasing the material cost.

Description of Related Art

In general, the slide rail structure is installed between a cabinet or server bracket and a drawer (or server) and provided for driving the drawer (or server) to slide linearly relative to the cabinet or server bracket, and the slide rail structure is formed by an inner rail, a middle rail, an outer rail and a plurality of slip elements, and the inner rail is securely fixed to the outer surface of the drawer (or server), and the outer rail is securely fixed to the cabinet or server bracket. When the slide rail structure is in use, the drawer (or server) can be pulled out together with the inner rail, and linked and pulled out with the middle rail until the slide rail is fully extended. Since the middle rail carries the drawer (or server), therefore when the slide rail is not in use, the drawer (or server) together with the inner rail and the middle rail must be pushed into the outer rail to avoid subsequent plastic deformation of the middle rail in order to prevent affecting the performance and service life of the slide rail.

While taking a server specifically used for slide rails as an example, using the American UL testing standard for reference, and assuming that the weight of the server chassis to be loaded is x Kg, the result of multiplying the weight of the server chassis by 1.5 times and then adding the total weight of 33 kg, which is (1.5x+33) Kg is used as the testing standard for the load. Therefore, after the testing standard is set up according to the load and weight of different server chassis, the testing standard will be raised or lowered. According to the aforementioned testing standard, after the server chassis drives the slide rail to be fully extended, the slide rail should be able to withstand the weight of the server chassis for more than one minute, so that the server chassis will not fall, and the slide rail must also be retreated smoothly to meet the safety requirements of the testing standard. In this test, the slide rail must be fully extended, and its inner rail is fixed on the outside of the server chassis and in front of the server bracket. At this time, the middle rail is situated at a position relative to the outer side of the front bracket which is used to fix the outer rail. In other words, such position falls in an area that is not covered by the front bracket or the outer rail at all, so that the middle rail may be distorted and deformed easily due to the load and weight in this area. Therefore, some manufactures increase the height of the slide rail structure to improve the tolerance of the vertical force in order to improve the stability of the structure, but such reinforcement method will not only increase the manufacturing cost, but also will increase the total volume and weight, reduce the number of servers that can be installed on the server bracket, increase the cost and cause inconvenience to users. It is noteworthy that the space for installing the corresponding servers is limited, so that these methods of increasing the strength will reduce the installation space, increase the level of difficulty of the installation, or require an adjustment of the size of the server chassis that will increase an additional production cost. Therefore, how to increase the structural strength of the slide rail of the server after extending the slide rail without changing the height of the slide rail is a subject to be solved by this disclosure.

As disclosed in R.O.C. Pat. Nos. I448262, I578886 and I610639, these patented technologies adopt a reinforcing element to reinforce the bracket of the slide rail or the slide rail itself and improve the load strength of the slide rail. In R.O.C. Pat. No. I448262, a reinforcing channel is designed between a rail and an extension bracket, and a reinforcing element is inserted into the reinforcing channel to achieve the purpose of increasing the structural strength of the rail. The objective of this patented technology is to achieve the reinforcing effect in a limit space. In R.O.C. Pat. No. I578886, a three-section slide rail is provided, and a first auxiliary support is installed in a gap formed by a first rail and a second rail, and a second auxiliary support and a reinforcing element installed between the second rail and the third rail, and the first auxiliary support, the second auxiliary support and the reinforcing element are used to improve the structural strength. In R.O.C. Pat. No. I610639, a reinforcing spacer is installed on an outer side of a first rail, and a reinforcing element is installed between the first rail and the second rail, and a support is installed on an inner side of the second rail to increase the support capacity when carrying a load and achieve the effect of strengthening the structural strength of the rails. However, actual tests show that the support effect achieved by the foregoing methods of increasing the structural strength is quite limited, especially for server chassis of 3U or above due to the substantial increase in weight, which usually exceeds the load capacity of the slide rail. When the server chassis is pulled out from the rack, the weight of the server chassis only relies on the middle rail for the support, so that it is really difficult to support the server chassis effectively, and these methods obviously required further improvements.

SUMMARY

The primary objective of the present disclosure is to provide a geometric reinforcing structure for a slide rail, in which a plurality of geometric reinforcing blocks is formed on a portion of a middle rail other than those overlapped with an inner rail and an outer rail by stamping, such that the reinforcing blocks can be equidistantly spaced and configured relative to each other along the extension direction of the middle rail for improving the strength of pulling out a load.

To achieve the aforementioned and other objectives, this disclosure discloses a geometric reinforcing structure for a slide rail, wherein the slide rail includes an inner rail, a middle rail, an outer rail and a plurality of slip elements, and the slip elements are movably installed between the inner rail and the middle rail, and between the middle rail and the outer rail respectively, such that the inner rail and the middle rail can be sequentially pulled out and extended to the outside relative to the outer rail, characterized in that the middle rail includes a plurality of reinforcing blocks, which have identical geometric figure, formed on a surface of the middle rail by stamping, and equidistantly spaced and configured relative to each other along the extension direction of the middle rail, and a configuration means provided for forming an interference portion between two adjacent reinforcing blocks to improve the load strength of pulling out.

In an embodiment of this disclosure, each of the reinforcing blocks is formed into a geometric figure selected from the group consisting of an ellipse, a rectangle, a parallelogram, a trapezoid and a hexagon; the reinforcing blocks are convexly formed on the inner surface of the middle rail and configured to be relative to the inner rail, and disposed at a position other than the overlapping part of the middle rail and the inner rail, the overlapping part of the middle rail and the outer rail, and the remaining area of the middle rail other than the area having mechanical elements installed thereon. In addition, the height of the reinforcing blocks protruded out from a surface falls within a range of 0.8~1.2 mm. In another embodiment of this disclosure, the two adjacent reinforcing blocks have a predetermined spacing distance from each other, and the predetermined spacing distance falls within a range of 1.52~2.76 mm.

Wherein, the configuration means is to rotate all or part of the reinforcing blocks with an angle, and the rotation angle is preferably 45 degrees; the configuration means is that the geometric figures of the reinforcement blocks have a reference edge with an inclined angle, and the reference edges are parallelly and evenly aligned, spaced, and configured; the reference edge has the inclined angle of 45 degrees relative to its adjacent edge, and if the geometric figure is a hexagon with a substantially arrow-head shape, the configuration means is that the geometric figures of the reinforcing blocks have a V-shaped reference edge with an inclined angle, and the V-shaped reference edges are parallelly and evenly aligned, spaced and configured; the V-shaped reference edges have an included angle of substantially 90 degrees, and the inclined angle of 45 degrees relative to adjacent edge. Actual tests indicated that the reinforcing blocks in the aforementioned shapes and configuration can help improve the load strength.

DESCRIPTION OF THE EMBODIMENTS

Figure 1:
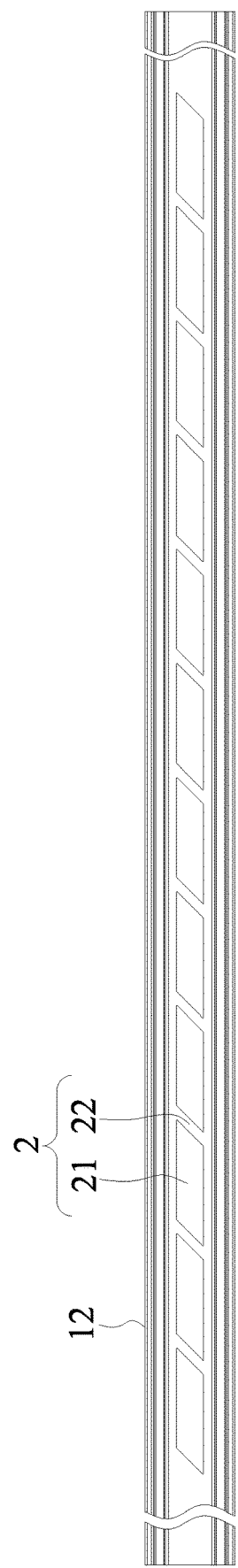
FIG. 1 is a schematic view of the structure of a first preferred embodiment of this
disclosure.
Figure 2:
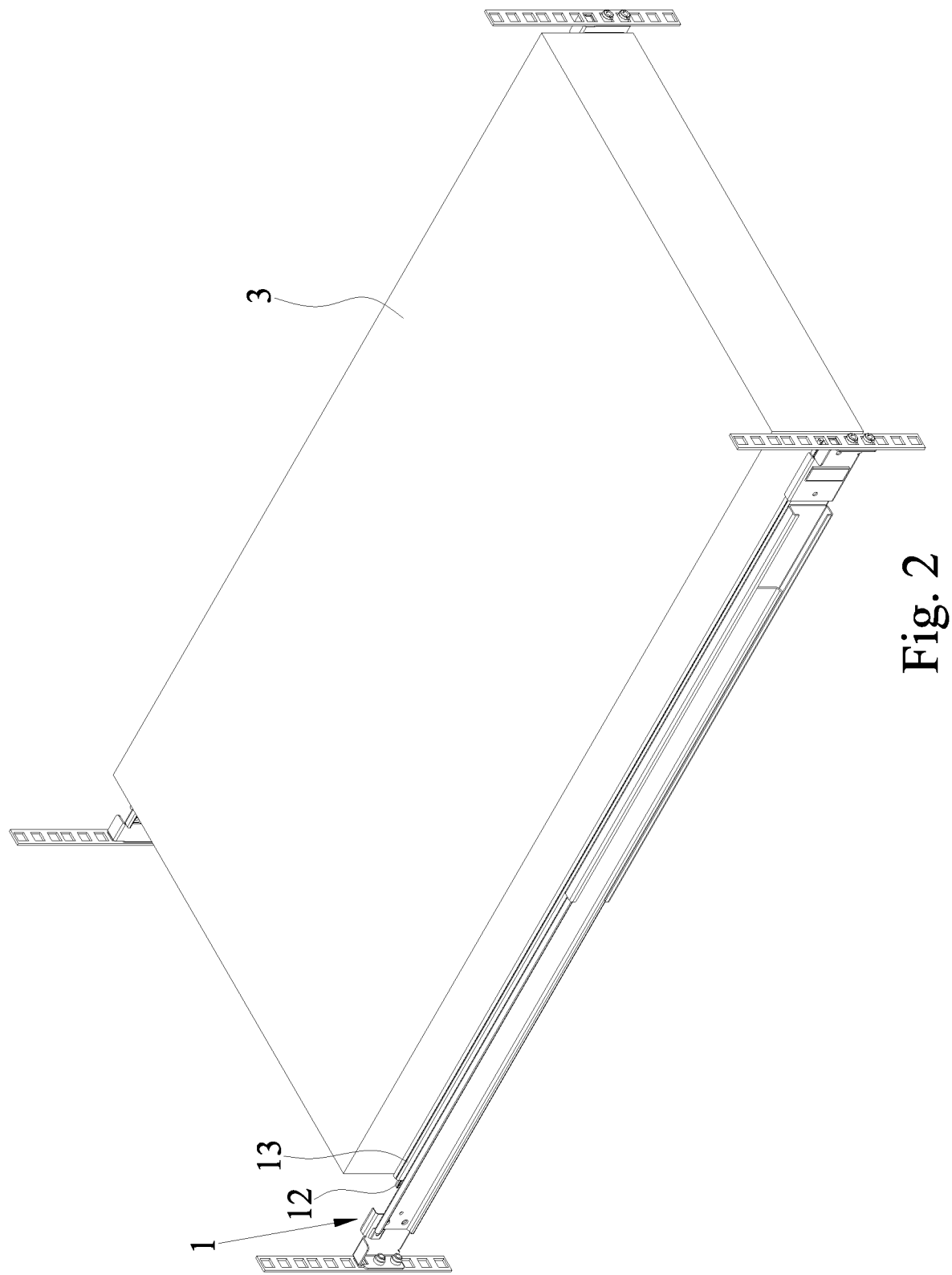
FIG. 2 is a schematic view showing the status of the first preferred embodiment of this disclosure during installation.

This disclosure will now be described in more detail with reference to the accompanying drawings that show various embodiments of this disclosure.

With reference to FIGS. 1, 2, 3 and 4~7 for the schematic views of the structure of a geometric reinforcing structure 2 of a slide rail 1 in accordance with the first preferred embodiment of this disclosure, its status during installation, its being exerted with a force when carrying a load, and the structures of various preferred embodiments respectively, the slide rail 1 includes an inner rail 11, a middle rail 12, an outer rail 13 and a plurality of slip elements 14, and the slip elements 14 are movably installed between the inner rail 11 and the middle rail 12, and between the middle rail 12 and the outer rail 13, such that the inner rail 11 and the middle rail 12 can be sequentially pulled out and extended to the outside relative to the outer rail 13.

The geometric reinforcing structure 2 has a plurality of reinforcing blocks 21, which have identical geometric figure, formed on a surface of the middle rail 12 by stamping, and the reinforcing blocks 21 are equidistantly spaced and configured from each other along the extension direction of the middle rail 12, and a configuration means is provided for forming an interference portion 22 between two adjacent reinforcing blocks 21 to improve the load strength of pulling out. It is noteworthy that each reinforcing block 21 of this disclosure is in a shape of ellipse, rectangle, parallelogram, trapezoid, hexagon or other geometric figures. In addition, the reinforcing blocks 21 is convexly formed on an inner surface of the middle rail 12 configured to be relative to the inner rail 11, and disposed at a position other than the overlapping part of the middle rail 12 and the inner rail 11, and the overlapping part of the middle rail 12 and the outer rail 13, and the remaining area of the middle rail 12 other than the area having mechanical elements installed on the middle rail 12. Actual tests show that he height of the reinforcing blocks 21 protruded out from a surface falls within a range of 0.8~1.2 mm, the two adjacent reinforcing blocks 21 have a predetermined spacing distance from each other, and the predetermined spacing distance falls within a range of 1.52~2.76 mm. In FIG. 1, the configuration means is that the geometric figures of the reinforcement blocks 21 have a reference edge with an inclined angle, and the reference edges are parallelly and evenly aligned, spaced, and configured, and the reference edge has the inclined angle of 45 degrees relative to its adjacent edge. In other words, the geometric figure is a parallelogram.

Figure 4:
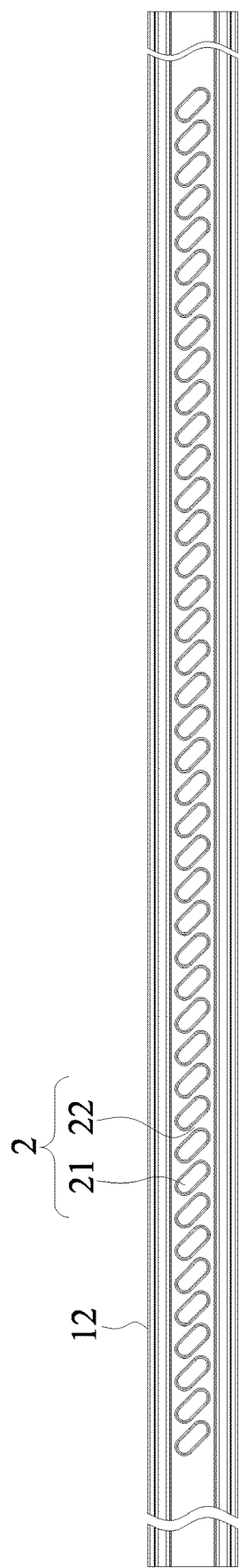
FIG. 4 is a schematic view of the structure of a second preferred embodiment of this disclosure.
Figure 5:
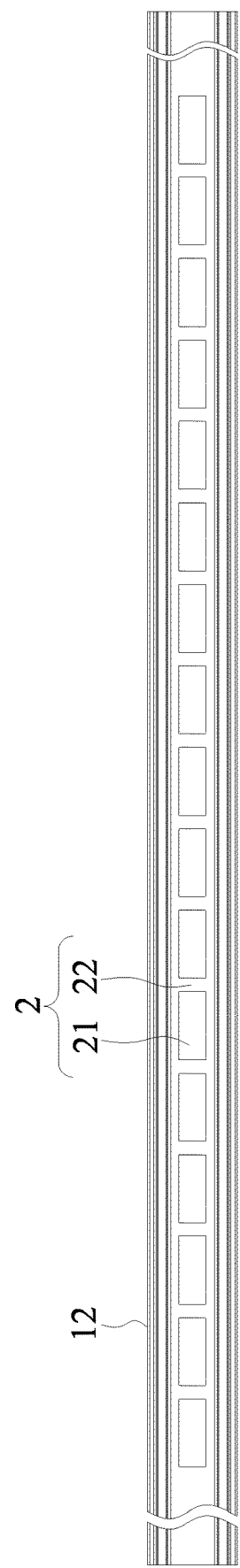
FIG. 5 is a schematic view of the structure of a third preferred embodiment of this disclosure.
Figure 6:
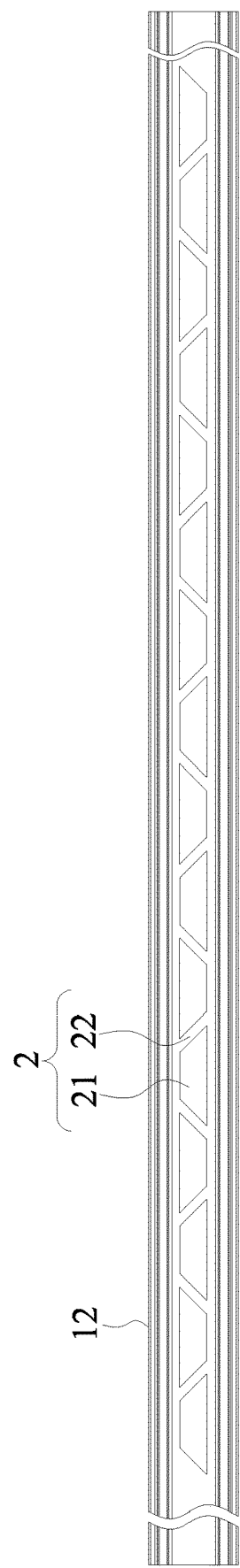
FIG. 6 is a schematic view of the structure of a fourth preferred embodiment of this disclosure.
Figure 7:
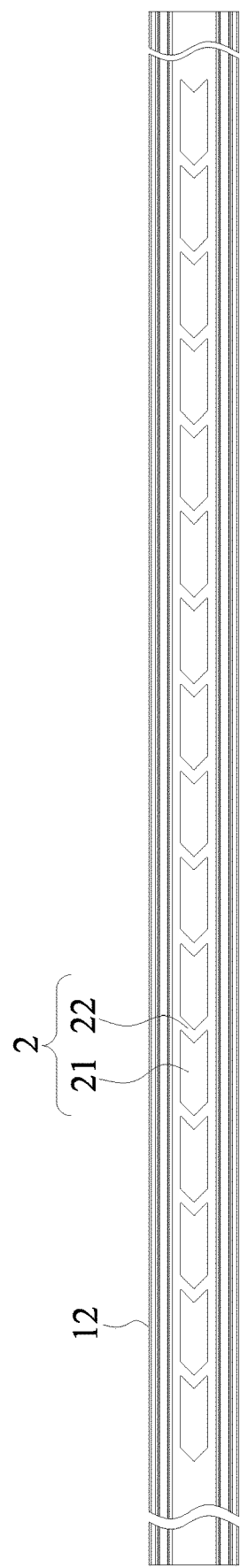
FIG. 7 is a schematic view of the structure of a fifth preferred embodiment of this disclosure.

In FIG. 4, the reinforcing blocks 21 are in an elliptical shape, and the configuration means is to rotate all of the reinforcing blocks 21 with an angle, preferably 45 degrees to present a state of obliquely spaced arrangement. In FIG. 7, when the geometric figure is a hexagon with a substantially arrow-head shape, the configuration means is that the geometric figures of the reinforcing blocks have a V-shaped reference edge with an inclined angle, and the V-shaped reference edge is parallelly and evenly aligned, spaced and configured, and the V-shaped reference edges have an included angle of 90 degrees, and the inclined angle of 45 degrees relative to their adjacent edge.

Figure 3:
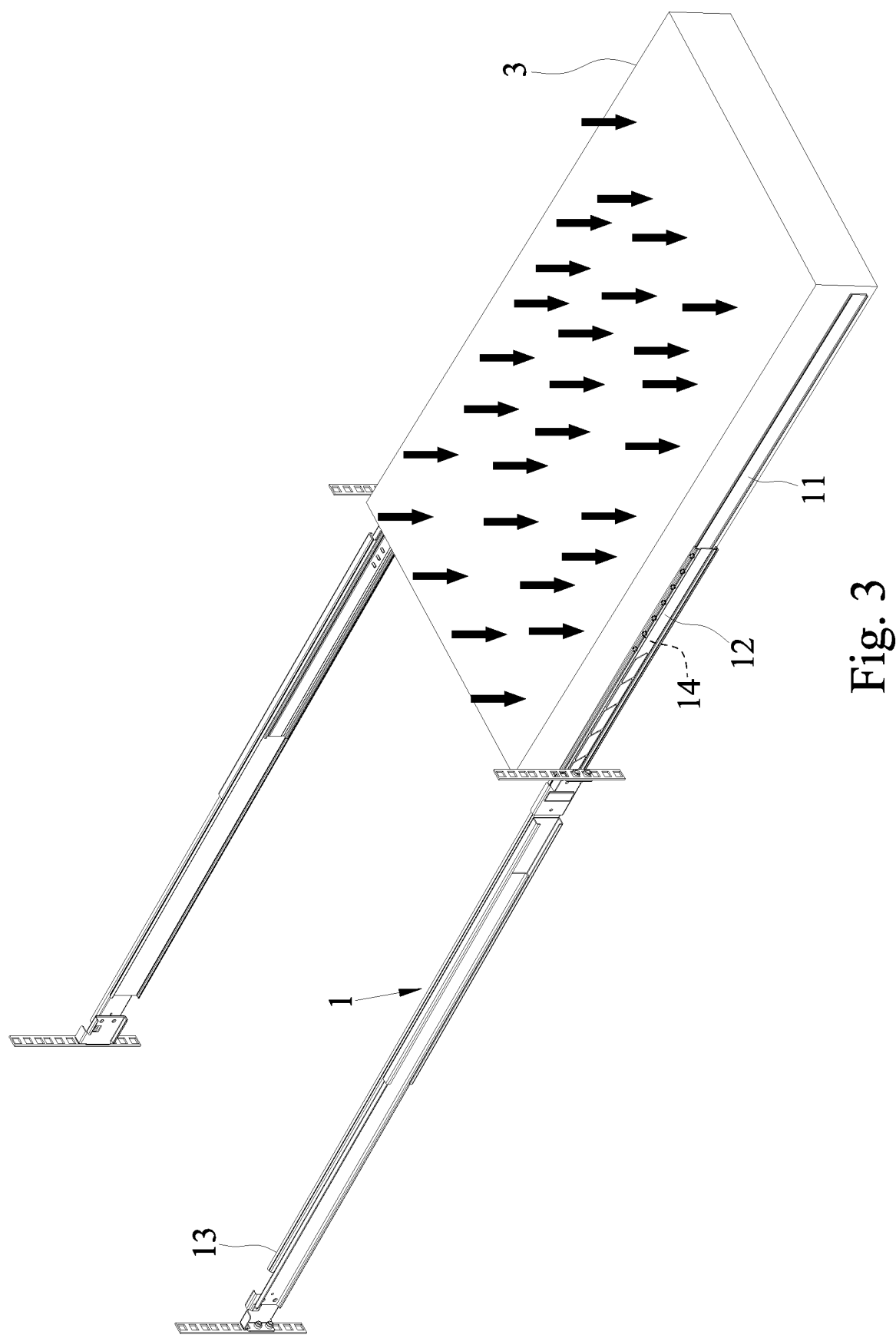
FIG. 3 is a schematic view showing the force exerted on the first preferred embodiment of this disclosure when carrying a load.

In this way, this disclosure, when a server 3 is pulled out in an operation, the inner rail 11 and the middle rail 12 of the slide rail 1 will be pulled out together relative to the outer rail 13. During the pulling process, since the reinforcing blocks 21 are sequentially pull and the interference portions 22 are provided for improving the strength of pulling the server 3. In FIG. 3, the weight of the server 3 is mainly concentrated in the central part, but both sides of the server 3 are limited by the inner rail 11, so that after the sever is pulled out, the middle rail 12 will be continuously stressed to produce a downward pressure that causes the middle rail 12 to bend. The geometric reinforcing structure 2 of this disclosure not only increases the surface thickness by the reinforcing blocks 21 in order to improve the surface strength of the middle rail 12, but also arranges the reinforcing blocks 21 to be equidistantly spaced and configured along the extension direction of the middle rail 12, such that the interfering portions 22 are mutually abutted to provide a support to achieve the effects of preventing the bending the middle rail 12 and improving the strength of pulling out a load.

What is claimed is:

1. A geometric reinforcing structure for a slide rail, wherein the slide rail comprises an inner rail, a middle rail, an outer rail and a plurality of slip elements, and the slip elements are movably installed between the inner rail and the middle rail, and between the middle rail and the outer rail respectively, such that the inner rail and the middle rail can be sequentially pulled out and extended to the outside relative to the outer rail, characterized in that:

the middle rail comprises a plurality of reinforcing blocks, which have identical geometric figure, formed on a surface thereof by stamping, and equidistantly spaced and configured relative to each other along the extension direction of the middle rail, and a configuration means provided for forming an interference portion between two adjacent reinforcing blocks to improve load strength of pulling out, wherein a number of the reinforcing blocks is greater than three, and in a plan view, in a direction vertical to a long side of the middle rail, each of the reinforcing blocks, other than a rightmost reinforcing block and a leftmost reinforcing block, comprises a first portion and a second portion, the first portion overlaps at least a part of an adjacent reinforcing block, and the second portion is overlapped by at least a part of another adjacent reinforcing block.

2. The geometric reinforcing structure for a slide rail according to claim 1, wherein each of the reinforcing blocks is a geometric figure selected from a group consisting of an ellipse, a parallelogram, a trapezoid, and a hexagon.

3. The geometric reinforcing structure for a slide rail according to claim 2, wherein the reinforcing blocks are convexly formed on the inner surface of the middle rail and configured to be relative to the inner rail, and disposed at a position other than overlapping part of the middle rail and the inner rail, overlapping part of the middle rail and the outer rail, and remaining area of the middle rail other than the area having mechanical elements installed thereon.

4. The geometric reinforcing structure for a slide rail according to claim 3, wherein the height of the reinforcing blocks protruded out from a surface falls within a range of 0.8~1.2 mm.

5. The geometric reinforcing structure for a slide rail according to claim 4, wherein the two adjacent reinforcing blocks have a predetermined spacing distance from each other, and the predetermined spacing distance falls within a range of 1.52~2.76 mm.

6. The geometric reinforcing structure for a slide rail according to claim 5, wherein an angle is formed between all or part of the reinforcing blocks and the long side of the middle rail, and the angle is different from 0, 90, and 180 degrees.

7. The geometric reinforcing structure for a slide rail according to claim 5, wherein the configuration means is that the geometric figures of the reinforcing blocks have a reference edge with an inclined angle, and the reference edges are parallelly and evenly aligned, spaced, and configured.

8. The geometric reinforcing structure for a slide rail according to claim 7, wherein the reference edge has the inclined angle of 45 degrees relative to adjacent edge.

9. The geometric reinforcing structure for a slide rail according to claim 5, wherein if the geometric figure is a hexagon with a substantially arrow-head shape, the configuration means is that the geometric figures of the reinforcing blocks have a V-shaped reference edge with an inclined angle, and the V-shaped reference edges are parallelly and evenly aligned, spaced and configured.

10. The geometric reinforcing structure for a slide rail according to claim 9, wherein the V-shaped reference edges have an included angle of substantially 90 degrees, and the inclined angle of 45 degrees relative to adjacent edge.

11. The geometric reinforcing structure for a slide rail according to claim 1, wherein each of the reinforcing blocks further comprises a third portion located between the first portion and the second portion, and the third portion does not overlap or is not overlapped by the adjacent reinforcing block and the another adjacent reinforcing block.

12. The geometric reinforcing structure for a slide rail according to claim 6, wherein the angle is 45 degrees.

* * * * *